(12) United States Patent
Laio et al.

(10) Patent No.: US 7,295,441 B1
(45) Date of Patent: Nov. 13, 2007

(54) HEAT DISSIPATING TYPE PRINTED CIRCUIT BOARD AND STRUCTURE THEREOF FOR CONDUCTING HEAT WITH HEAP PIPE

(75) Inventors: Tse-Hsine Laio, Xindian (TW); Ting-Kuo Kao, Xindian (TW)

(73) Assignee: Giga-Gyte Technology Co. Ltd., Taipei (TW)

( * ) Notice: Subject to any disclaimer, the term of this patent is extended or adjusted under 35 U.S.C. 154(b) by 55 days.

(21) Appl. No.: 11/383,168

(22) Filed: May 12, 2006

(51) Int. Cl.
*H05K 7/20* (2006.01)

(52) U.S. Cl. .............. 361/719; 361/700; 361/701; 361/702; 361/720; 165/80.3; 165/80.4; 165/80.5; 257/713; 257/714; 257/715

(58) Field of Classification Search ........... 361/687, 361/689, 698–702, 719, 720, 721, 742, 758, 361/760, 762, 770, 802–804; 174/15.2, 16.3, 174/138 G, 138 D, 16.1, 252; 165/80.1, 165/80.2, 80.3, 185, 104.33, 122, 126; 257/706, 257/719, 720
See application file for complete search history.

(56) References Cited

U.S. PATENT DOCUMENTS

| | | | |
|---|---|---|---|
| 5,793,611 A | * | 8/1998 | Nakazato et al. ........... 361/704 |
| 6,008,987 A | * | 12/1999 | Gale et al. .................. 361/700 |
| 6,351,385 B1 | * | 2/2002 | Featherstone, III ......... 361/704 |
| 7,057,895 B2 | * | 6/2006 | Mejia et al. ................ 361/700 |

FOREIGN PATENT DOCUMENTS

| | | | |
|---|---|---|---|
| JP | 405029717 A | * | 2/1993 |
| JP | 411068371 A | * | 3/1999 |

* cited by examiner

*Primary Examiner*—Michael Datskovskiy (57) ABSTRACT

A heat dissipating type printed circuit board and its structure for conducting heat with a heat pipe include a substrate, a signal circuit disposed on a surface of the substrate and electrically coupled to an electronic component, a heat dissipating layer disposed on another surface of the substrate, and at least one heat pipe, each having a heated end and a condensing end extended from the heated end. The substrate includes a through hole passing through the heat dissipating layer, and the heat dissipating layer includes an adhering layer disposed at a surface proximate to the surroundings of the heat pipe, and a distal end of the heated end of the heat pipe is covered by the adhering layer, and the adhering layer is extended from the surface of the heat dissipating layer to a corresponding position of the electronic component.

17 Claims, 7 Drawing Sheets

HEAT DISSIPATING TYPE PRINTED CIRCUIT BOARD AND STRUCTURE THEREOF FOR CONDUCTING HEAT WITH HEAP PIPE

BACKGROUND OF THE INVENTION

1. Field of the Invention

The present invention relates to a heat dissipating type printed circuit board and its structure for conducting heat with a heat pipe, and more particularly to a thermal conducting structure connected to a printed circuit board for providing high-performance heat dissipations for the printed circuit board and conducting heat with a heat pipe.

2. Description of Prior Art

To enhance the heat dissipating effect of a printed circuit board (PCB), most printed circuit boards add heat dissipating holes, electroplate metal films, install metal lumps on the backside of the printed circuit boards, or directly coat a heat dissipating paste onto the printed circuit boards for dissipating heat.

Regardless of which one of the foregoing methods is used to provide the required heat dissipation function for the printed circuit boards, the best this method can do is to conduct the heat energy produced by an electronic component to a heat dissipating hole, a metal film, a metal lump or a heat dissipating paste, but it cannot provide an effective heat path to conduct the heat to a farther end. Such arrangement only increases the temperature of surrounding air, so that when the heat keeps increasing, the temperature of the air around the printed circuit board will be affected. Once the temperature of air and the heat dissipating structure of the printed circuit board reach a thermal equilibrium, the thermal conducting performance and the heat dissipating effect of the printed circuit board drop gradually and affect the electronic components indirectly.

SUMMARY OF THE INVENTION

In view of the foregoing shortcomings of the prior art, the inventor of the present invention based on years of experience in the related industry to conduct experiments and modifications, and finally designed a feasible solution to overcome the shortcomings of the prior art.

The present invention is to overcome the shortcomings of the prior art by providing a heat dissipating type printed circuit board and its structure for conducting heat with a heat pipe, so as to effectively solve the heat dissipating problem of the printed circuit boards. The invention connects a heat pipe to the printed circuit board for conducting heat and effectively lowers the temperature of the printed circuit board and its electronic components and also allows the electronic components to operate under a permissible operating temperature and maintain a stable operation of an electronic system.

The present invention provides a heat dissipating type printed circuit board, comprising a substrate, a heat dissipating layer and at least one heat pipe. The substrate has a signal circuit disposed on a surface of the substrate and electrically coupled to an electronic component. The heat dissipating layer is disposed on another surface of the substrate. The heat pipe has a heated end, and a condensing end extended from the heated end. The substrate includes a through hole passing through the heat dissipating layer and an adhering layer disposed on the heat dissipating layer proximate to the surroundings of the heat pipe and a distal end of the heated end of the heat pipe is covered by the adhering layer, and the adhering layer is extended from the heat dissipating layer to a corresponding position of the electronic component.

The present invention provides a structure of a printed circuit board for conducting heat with a heat pipe, comprising a printed circuit board and at least one heat pipe. The printed circuit board has a substrate, a signal circuit disposed on a surface of the substrate, a heat dissipating layer disposed on another surface of the substrate, and a through hole disposed on the substrate and passing through the heat dissipating layer. The heat pipe has a heated end passing through the through hole of the substrate, and a distal end of the heated end being protruded out from the heat dissipating layer. The heat dissipating layer includes an adhering layer disposed on a surface proximate to the surroundings of the heat pipe, and the distal end of the heated end of the heat pipe is covered by the adhering layer.

BRIEF DESCRIPTION OF DRAWINGS

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

The technical characteristics, features and advantages of the present invention will become apparent in the following detailed description of the preferred embodiments with reference to the accompanying drawings. However, the drawings are provided for reference and illustration only and are not intended for limiting the scope of the invention.

Figure 1:
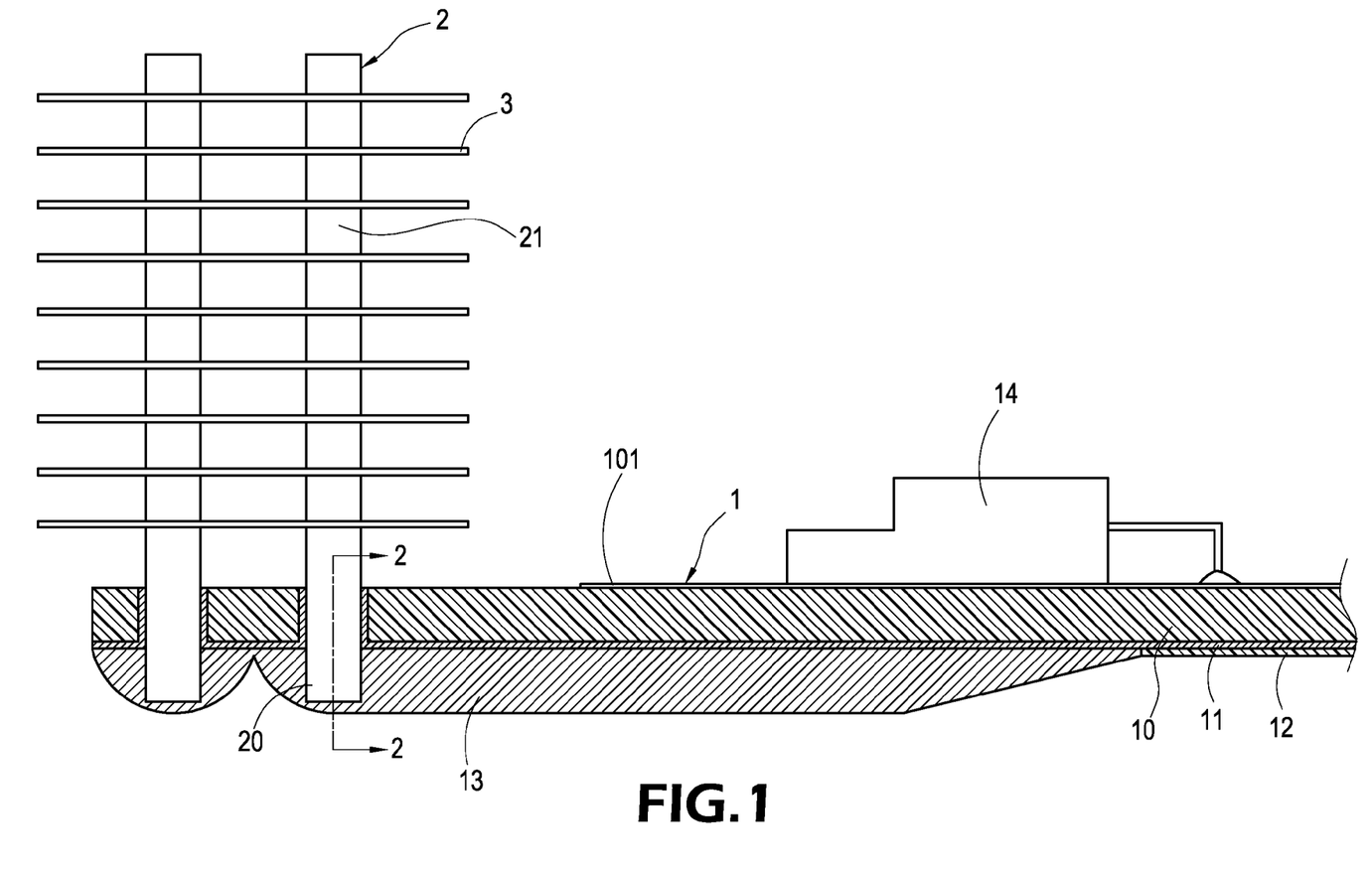
FIG. 1 is a schematic planar view of a first preferred embodiment of the present invention.

Referring to FIG. 1 for the schematic view of a first preferred embodiment of the present invention, the invention provides a heat dissipating type printed circuit board and its structure for conducting heat with a heat pipe, and the printed circuit board 1 comprises a substrate 10 made of an insulating material, a signal circuit 101 disposed on a surface of the substrate 10 and electrically coupled to an electronic component 14 and a heat dissipating layer 11 disposed on another surface of the substrate 10. The heat dissipating layer 11 can be made of a copper foil or other heat dissipating metal and an insulating coating 12 is covered onto the heat dissipating layer 11.

The invention connects the printed circuit board 1 and a heat pipe 2 for conducting heat, and the heat accumulated at the heat dissipating layer 11 can be dissipated by the high thermal conductivity of the heat pipe 2. The heat pipe 2 is a heat conducting component with a high thermal conducting power, a fast heat transfer and a high thermal conductivity, and also can transfer a great deal of heat energy without consuming much electric power, thus heat pipes have become an extensively used component for dissipating heat for present electronic products. The general principle of a heat pipe 2 mainly installs a wick structure on the internal wall of the heat pipe, and the pipe is in a vacuum state. The wick structure could be a woven net or a sintered powder capable of performing a capillary action. With the capillary action of the wick structure, a working fluid in the heat pipe can be transmitted easily. If an end of the heat pipe is heated, the working fluid in the heat pipe will be heated as well, and the working fluid will change its liquid phase into a gas phase. The heat energy absorbed by the working fluid is conducted to another end of the heated end and another end is cooled to convert the gas phase back to the liquid phase. In the meantime, the capillary action produced by the wick structure drives the working fluid in a liquid phase back to the heated end of the heat pipe for performing heat exchanges repeatedly.

Figure 2:
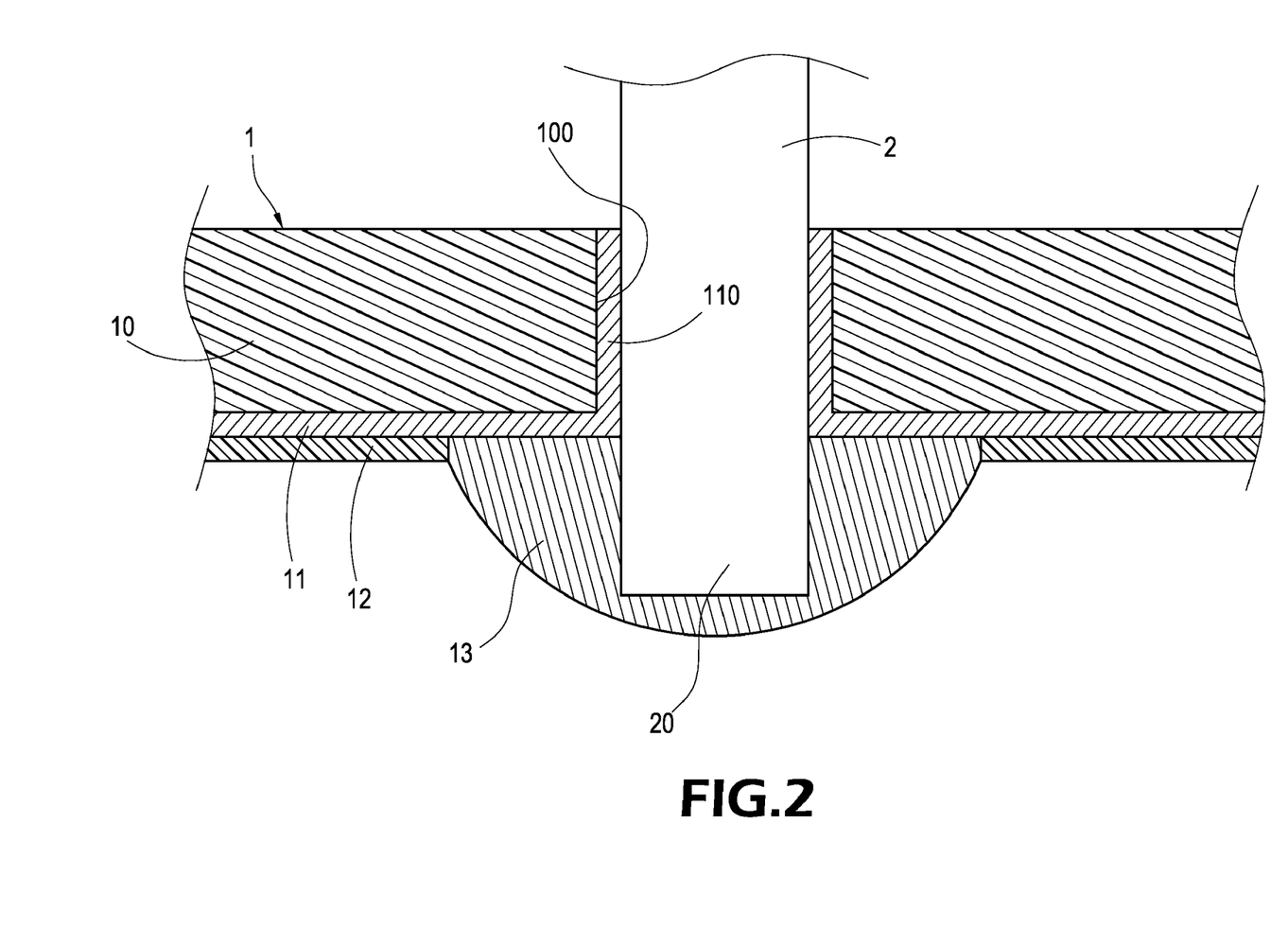
FIG. 2 is a cross-sectional view of line 2-2 as depicted in FIG. 1.

Referring to FIG. 2 as well, the printed circuit board 1 has a through hole 100 disposed on the substrate 10 and penetrating through the heat dissipating layer 11 for passing the heat pipe 2, and the number of through holes 100 depends on the number of heat pipes 2 being installed. Basically, one through hole 100 is provided for one heat pipe 2, and there is at least one heat pipe 2. The number of through holes 100 can be increased according to the actual need of the thermal conduction. The heat pipe 2 has a heated end 20 and a condensing end 21 extended outwardly from the heated end 20, wherein the heated end 20 passes through the through hole 100 of the substrate 10, and a distal end of the heated end 20 is protruded out from the heat dissipating layer 11, and the surroundings of the through hole 100 of the heat dissipating layer 11 are exposed to the outside. In other words, no insulating coating 12 is covered on the surroundings of the through hole 100 of the heat dissipating layer 11, and if the heat dissipating layer 11 is made of copper, then such exposed area is known as a bare copper. If the printed circuit board 1 goes through a soldering furnace, a solid adhering layer that covers the distal end of the heated end 20 will be attached onto the heat dissipating layer 11 and disposed proximate to the surroundings of the heat pipe 2, so as to form a good thermal conducting contact between the heat pipe 2 and the heat dissipating layer 11 of the printed circuit board 1. The adhering layer 13 could be made of a solder and an appropriate quantity of solder is protruded to a specific height that gives a larger surface for improving the heat dissipating performance of the heat dissipating layer 11. In the meantime, the adhering layer 13 can be extended from the surface of the heat dissipating layer 11 to a corresponding position of the electronic component 14, and the remaining surface of the heat dissipating layer 11 which is not attached by the adhering layer is covered by the insulating coating 12 to prevent an excessively large area of the attached adhering layer 13 that results in an unnecessary cost.

Figure 3:
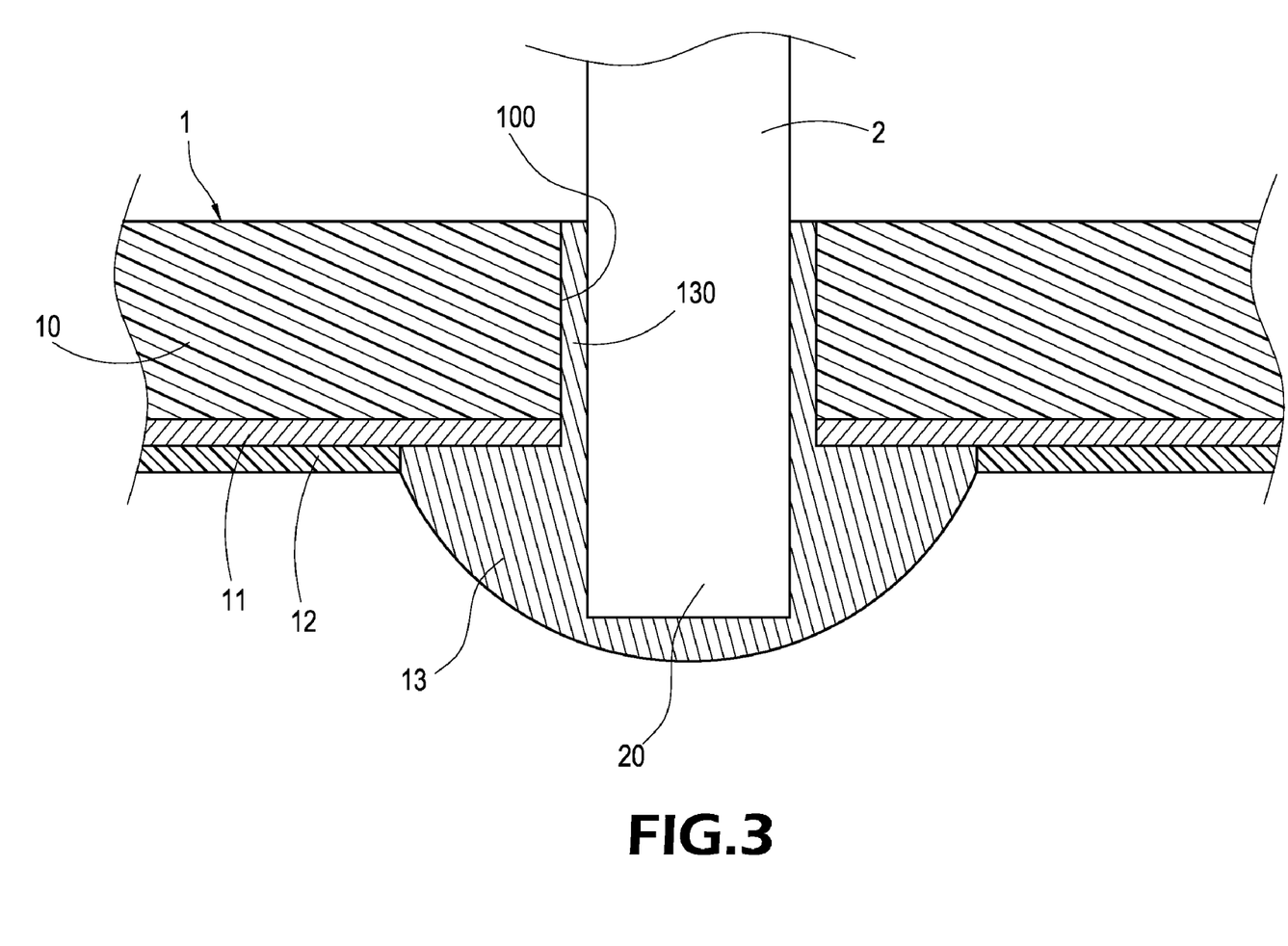
FIG. 3 is another cross-sectional view of line 2-2 as depicted in FIG. 1.
Figure 4:
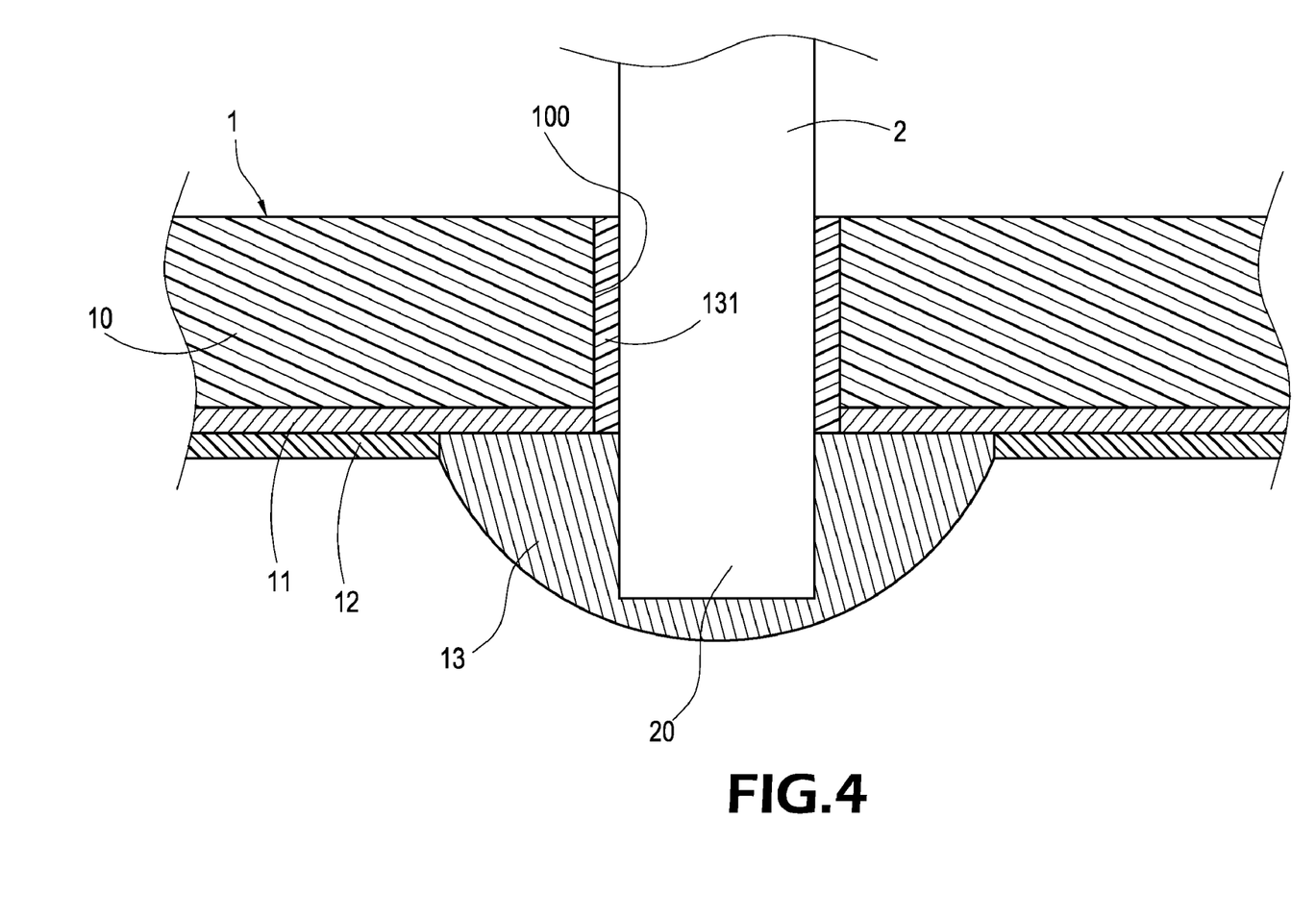
FIG. 4 is a further cross-sectional view of line 2-2 as depicted in FIG. 1.

To increase the contact area between the heat pipe 2 and the substrate 10, the wall of the through hole 100 includes a layer of thermal conducting medium disposed between the heat pipe 2 and the substrate 10 as shown in FIG. 2. The thermal conducting medium and the heat dissipating layer 11 could be made of the same material such as a copper foil 110. In FIG. 2, the heat dissipating layer 11 and the thermal conducting medium are plated onto the substrate 10. In FIG. 3, the thermal conducting medium and the adhering layer 13 could be made of the same material such as a solder 130, so that when the printed circuit board 1 goes through a soldering furnace, the liquid solder 130 is permeated through the gap between the heat pipe 2 and the through hole. In FIG. 4, the thermal conducting medium could be a heat dissipating paste 131 coated onto the external wall of the heated end 20 of the heat pipe 2 and passed through the through hole 100. In the preferred embodiment as shown in FIG. 2, although the wall of the through hole 100 is plated with a thermal conducting medium such as a copper foil 110, a heat dissipating paste 131 still can be coated on the external wall of the heat end 20 of the heat pipe 2 as shown in FIG. 4, and the heated end 20 is passed through the through hole 100 having a copper foil 110 on its wall to improve the contact between the heated end and the through hole 100.

In FIG. 1, both printed circuit board 1 and electronic component 14 produce heat energy when the electronic component 14 starts operating, and the heat energy is absorbed by the heat dissipating layer 11 and adhering layer 13 first and then conducted to the heated end 20 of the heat pipe 2. Although some heat energies will be dissipated from the protrusion of the adhering layer 13 to the surrounding air in the heat conducting path, a vast majority of the heat energies are conducted quickly from the heated end 20 of the heat pipe 2 to the condensing end 21 of the heat pipe 2. The condensing end 21 of the heat pipe 2 has a plurality of heat dissipating fins 3 for performing heat dissipations for the heat pipe 2.

Figure 5:
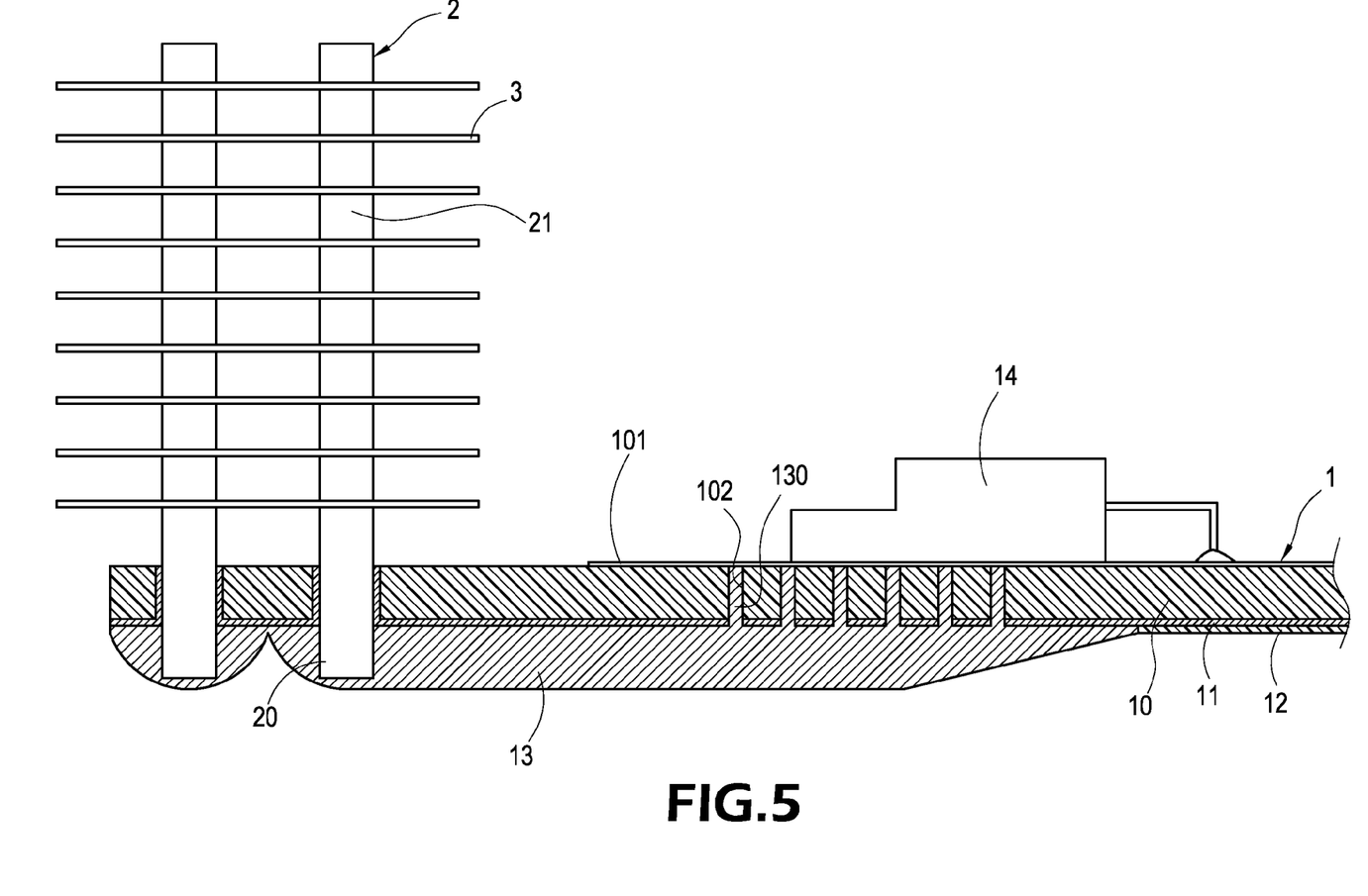
FIG. 5 is a schematic planar view of a second preferred embodiment of the present invention.

Referring to FIG. 5, the substrate 10 of the printed circuit board 1 includes a plurality of penetrating holes 102 disposed at corresponding positions of the electronic components 14 without causing an electromagnetic interference issue. The penetrating holes 102 are filled up by the solder 130 of the adhering layer 13 and in contact with the heat dissipating layer 11 for conducting heat, so that the heat energy produced by the electronic components 14 can be conducted quickly to the heat dissipating layer 11 or the adhering layer 13, so as to improve the heat dissipating performance of the printed circuit board 1.

With the foregoing structure, the heat dissipating type printed circuit board and its structure for conducting heat with a heat pipe can be accomplished.

Figure 6:
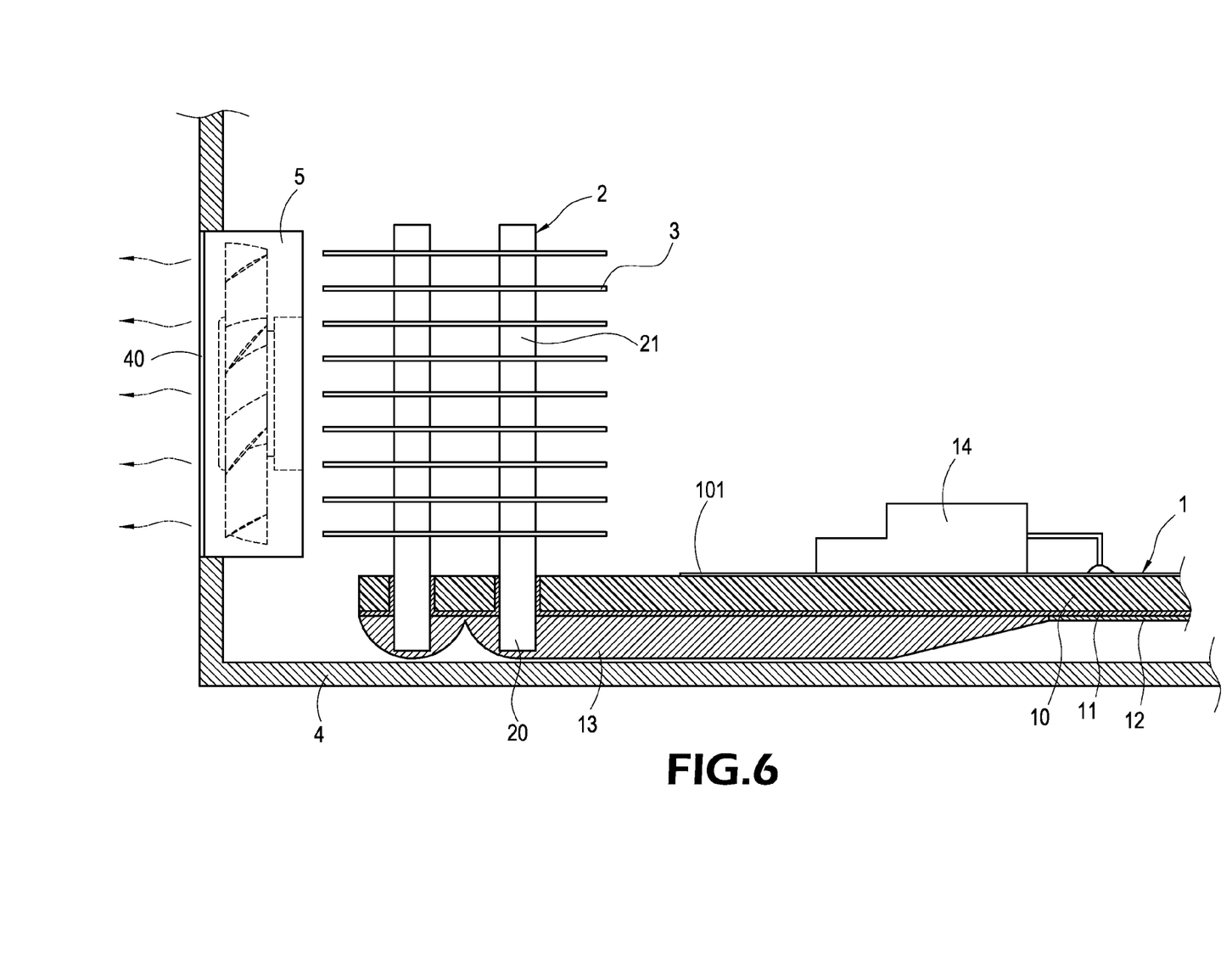
FIG. 6 is a schematic view of a first preferred embodiment applied in a computer casing according to the present invention.
Figure 7:
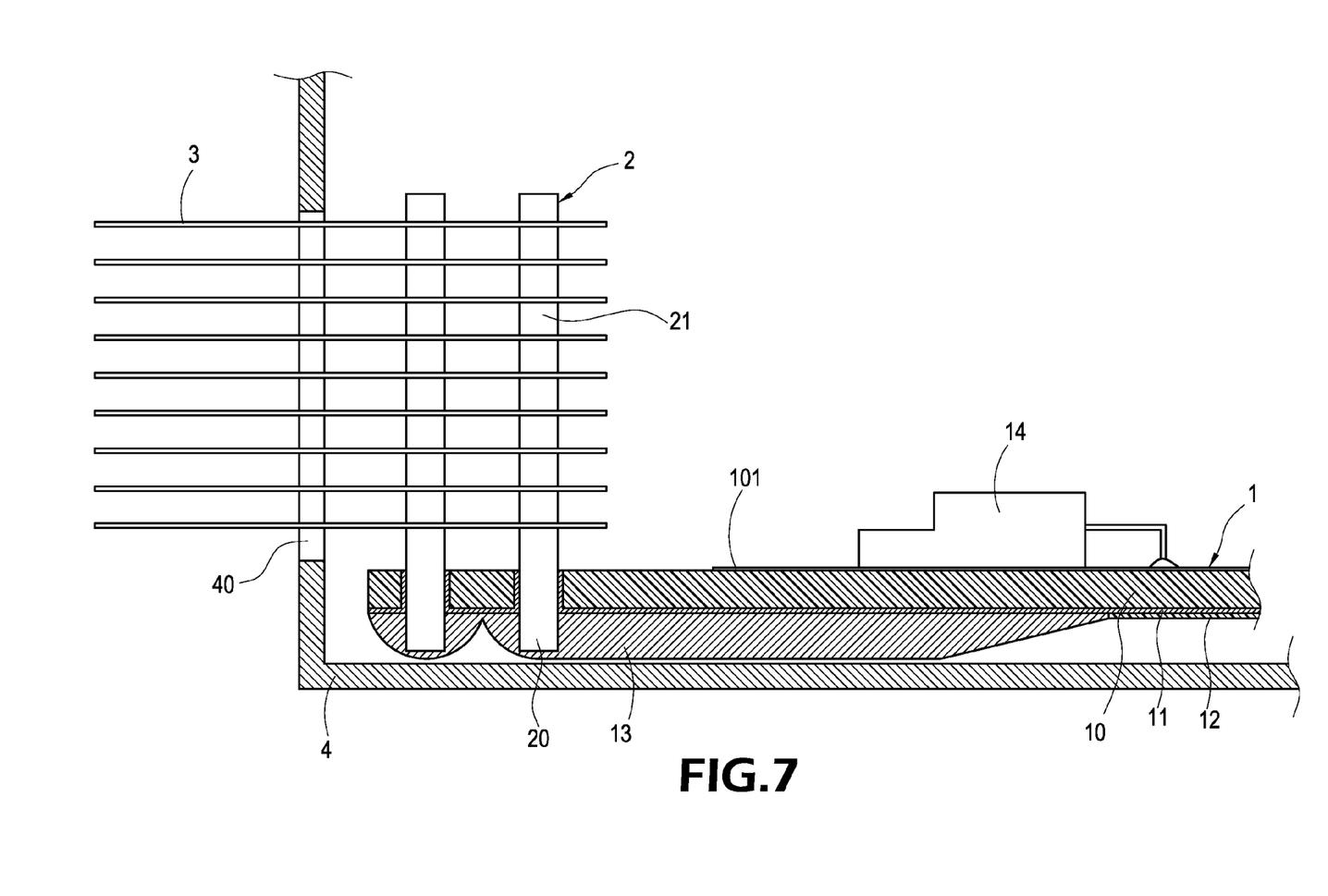
FIG. 7 is a schematic view of a second preferred embodiment applied in a computer casing according to the present invention.

Therefore, the heat dissipating type printed circuit board and its structure for conducting heat with a heat pipe in accordance with the invention can improve the heat dissipation for a printed circuit board 1, and they can be designed together with a casing of an electronic product, so that the heat produced by the printed circuit board 1 and its electronic components 14 can be conducted to the outside. In FIG. 6, the casing 4 includes a ventilation outlet 40, and the ventilation outlet 40 has a fan 5, and the heat dissipating fin 3 corresponds to the fan 5 for compulsorily discharging the heat energy out of the casing 4. In FIG. 7, the heat dissipating fin 3 can be extended out of the ventilation outlet 40 of the casing 4 for facilitating heat dissipations by the cooler air outside. Both of the foregoing embodiments can effectively lower the temperature of the printed circuit board 1 and prevent heat energy from being accumulated in the casing 4 that will results in a greenhouse effect.

In summation of the above description, the invention herein enhances the performance than the conventional structure and further complies with the patent application requirements.

The present invention are illustrated with reference to the preferred embodiment and not intended to limit the patent scope of the present invention. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A heat dissipating type printed circuit board, comprising:
    a substrate, having a signal circuit disposed on a surface of the substrate and electrically coupled to an electronic device;
    a heat dissipating layer, disposed on another surface of the substrate; and
    at least one heat pipe, having a heated end and a condensing end extended from the heated end,
    wherein the substrate includes a through hole penetrating the heat dissipating layer, and an adhering layer disposed on a surface of the heat dissipating layer and proximate to the surroundings of the heat pipe, and a distal end of the heated end of the heat pipe is covered by the adhering layer, and the adhering layer is extended from a surface of the heat dissipating layer to a corresponding position of the electronic device.

2. The heat dissipating type printed circuit board of claim 1, wherein the substrate includes a plurality of penetrating holes, each disposed at a corresponding position of the electronic device, and the penetrating holes are filled up by the adhering layer for having a thermal conducting contact with the heat dissipating layer.

3. The heat dissipating type printed circuit board of claim 1, wherein a wall of the through hole of the substrate includes a thermal conducting medium disposed between the heat pipe and the substrate.

4. The heat dissipating type printed circuit board of claim 3, wherein the thermal conducting medium is a heat dissipating paste.

5. The heat dissipating type printed circuit board of claim 3, wherein the thermal conducting medium and the heat dissipating layer are made of the same material.

6. The heat dissipating type printed circuit board of claim 3, wherein the thermal conducting medium and the adhering layer are made of the same material.

7. The heat dissipating type printed circuit board of claim 1, wherein the heat dissipating layer is a copper foil.

8. The heat dissipating type printed circuit board of claim 1, wherein the adhering layer is made of a solder.

9. The heat dissipating type printed circuit board of claim 1, wherein a remaining surface of the heat dissipating layer is covered by an insulating coating.

10. The heat dissipating type printed circuit board of claim 1, wherein the condensing end of the heat pipe includes a plurality of heat dissipating fins.

11. A structure of a printed circuit board for conducting heat with a heat pipe, comprising:
    a printed circuit board, having a substrate, a signal circuit disposed on a surface of the substrate, a heat dissipating layer disposed on another surface of the substrate, and a through hole disposed on the substrate and passing through the heat dissipating layer; and
    at least one heat pipe, having a heated end passing through the through hole of the substrate, so that a distal end of the heated end is protruded out from the heat dissipating layer, wherein, the heat dissipating layer includes an adhering layer disposed on a surface proximate to the surroundings of the heat pipe, and the distal end of the heated end of the heat pipe is covered by the adhering layer.

12. The structure of a printed circuit board for conducting heat with a heat pipe of claim 11, wherein a wall of the through hole of the substrate includes a thermal conducting medium disposed between the heat pipe and the substrate.

13. The structure of a printed circuit board for conducting heat with a heat pipe of claim 12, wherein the thermal conducting medium is a heat dissipating paste.

14. The structure of a printed circuit board for conducting heat with a heat pipe of claim 12, wherein the thermal conducting medium and the heat dissipating layer are made of the same material.

15. The structure of a printed circuit board for conducting heat with a heat pipe of claim 12, wherein the thermal conducting medium and the adhering layer are made of the same material.

16. The structure of a printed circuit board for conducting heat with a heat pipe of claim 11, wherein the heat dissipating layer is a copper foil.

17. The structure of a printed circuit board for conducting heat with a heat pipe of claim 11, wherein the adhering layer is made of a solder.

* * * * *

UNITED STATES PATENT AND TRADEMARK OFFICE
CERTIFICATE OF CORRECTION

PATENT NO.       : 7,295,441 B1                                   Page 1 of 1
APPLICATION NO.  : 11/383168
DATED            : November 13, 2007
INVENTOR(S)      : Tse-Hsine Liao et al.

It is certified that error appears in the above-identified patent and that said Letters Patent is hereby corrected as shown below:

Title Page item 75, first inventor's name, please replace "Tse-Hsine Laio" with --Tse-Hsine Liao--

Title Page item 73, Assignee name, please replace "Giga-Gyte" with --Giga-Byte--

Signed and Sealed this

Twenty-ninth Day of April, 2008

JON W. DUDAS
*Director of the United States Patent and Trademark Office*